(12) United States Patent
Kanamori et al.

(10) Patent No.: US 8,705,246 B2
(45) Date of Patent: Apr. 22, 2014

(54) ELECTRONIC PART AND CONNECTION STRUCTURE OF THE ELECTRONIC PART

(75) Inventors: Akitaka Kanamori, Shizuoka (JP); Takahiro Kadowaki, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 204 days.

(21) Appl. No.: 13/246,903

(22) Filed: Sep. 28, 2011

(65) Prior Publication Data
US 2012/0075819 A1  Mar. 29, 2012

(30) Foreign Application Priority Data
Sep. 29, 2010  (JP) .................. 2010-218451

(51) Int. Cl.
H05K 1/18 (2006.01)
H05K 7/00 (2006.01)

(52) U.S. Cl.
USPC ............................ 361/760; 361/789; 439/76.2

(58) Field of Classification Search
USPC ............ 361/679.01, 760, 767, 772, 776, 777, 361/789, 791, 792, 794, 801–804; 439/76.1, 76.2, 77, 78, 80, 81, 83, 84
See application file for complete search history.

(56) References Cited

U.S. PATENT DOCUMENTS

| | | | | |
|---|---|---|---|---|
| 4,862,245 A * | 8/1989 | Pashby et al. | .................. | 257/660 |
| 5,742,484 A * | 4/1998 | Gillette et al. | ................. | 361/789 |
| 6,031,730 A * | 2/2000 | Kroske | .......................... | 361/784 |
| 6,201,689 B1 * | 3/2001 | Miyasyo | .................. | 361/679.54 |
| 6,434,014 B1 * | 8/2002 | Gerdom et al. | ............... | 361/752 |
| 6,684,499 B2 * | 2/2004 | Romano et al. | ................. | 29/874 |
| 7,148,428 B2 * | 12/2006 | Meier et al. | .................... | 174/260 |
| 7,168,961 B2 * | 1/2007 | Hsieh | .............................. | 439/74 |
| 7,285,729 B2 * | 10/2007 | Gushiken | ...................... | 174/261 |
| 7,679,922 B2 * | 3/2010 | Miyata | .......................... | 361/749 |
| 7,948,763 B2 * | 5/2011 | Chuang | ......................... | 361/749 |
| 8,023,304 B2 * | 9/2011 | Choi | ................................ | 365/64 |
| 8,134,839 B2 * | 3/2012 | Yamazaki et al. | ............ | 361/749 |
| 2002/0012239 A1 * | 1/2002 | Dent | ............................. | 361/803 |
| 2005/0078463 A1 * | 4/2005 | Chheda et al. | ................ | 361/789 |
| 2005/0190545 A1 * | 9/2005 | Reznik et al. | ................ | 361/803 |
| 2006/0186522 A1 * | 8/2006 | Oohashi et al. | ............... | 257/679 |
| 2006/0231940 A1 * | 10/2006 | Doan | ............................ | 257/686 |
| 2006/0238991 A1 * | 10/2006 | Drako | .......................... | 361/796 |
| 2007/0042613 A1 * | 2/2007 | Yoda | .............................. | 439/34 |
| 2009/0315162 A1 * | 12/2009 | Liu et al. | ....................... | 257/676 |

FOREIGN PATENT DOCUMENTS

JP  2003168609 A  6/2003

OTHER PUBLICATIONS

English Patent Abstract of JP 2003168609, from esp@cenet, Published Jun. 13, 2003 (1 Page).

* cited by examiner

Primary Examiner — Adrian S Wilson
(74) Attorney, Agent, or Firm — Osha Liang LLP

(57) ABSTRACT

An electronic part includes an electronic part body, an electrode terminal that protrudes from the electronic part body, and that electrically connects the electronic part to an external electrode when a flexible conductor is joined to an electrode surface, and a holder made of an insulating material, and joined to the electronic part body. The holder is interposed between a mounting plate and the electronic part body when the electronic part is mounted to the mounting plate, and the holder is in contact with a surface of the electrode terminal opposite from the electrode surface.

10 Claims, 5 Drawing Sheets

ELECTRONIC PART AND CONNECTION STRUCTURE OF THE ELECTRONIC PART

BACKGROUND

1. Technical Field

The present invention relates to an electronic part and a connection structure of the electronic part. More particularly, the present invention relates to a connection structure for electrically connecting a terminal of a surface mounting electronic part to a circuit board.

2. Related Art

Various methods have been proposed as methods for electrically connecting a surface mounting part to a circuit board (see, for example, Patent Document 1). As described in, for example, Patent Document 1, a method in which a lead terminal of a transformer is fixed to a conductive pattern on a circuit board by solder and the like has been employed as a method for electrically connecting a surface mounting transformer to a conductive pattern formed on a circuit board. Other known methods include a method in which the lead terminal is laser-welded to the conductive pattern with a metal pad interposed therebetween, and a method in which the lead terminal is joined to the conductive pattern by a conductive adhesive.

[Patent Document 1]
Japanese Patent Application Laid-Open (Kokai) No. 2003-168609

SUMMARY

However, in the method in which the surface mounting part is fixed to the circuit board by solder and the method in which the surface mounting part is joined to the circuit board by the conductive adhesive, joint failure may be caused due to warping or bending of the lead terminal that protrudes from the electronic part, and the joint portion is not so reliable. The method in which the surface mounting part is fixed to the circuit board by laser welding requires a metal pad, which increases the cost.

One or more embodiments of the present invention provides an electronic part including an electronic part body, an electrode terminal that protrudes from the electronic part body, and that electrically connects the electronic part to an external electrode when a flexible conductor is joined to an electrode surface, and a holder made of an insulating material, and joined to the electronic part body, characterized in that the holder is interposed between a mounting plate and the electronic part body when the electronic part is mounted to the mounting plate, and the holder is in contact with a surface of the electrode terminal opposite from the electrode surface.

According to such an electronic part, because the surface of the electrode terminal opposite from the electrode surface is in contact with the holder, the electrode terminal is less likely to be warped or bent. Thus, joint failure and the like are less likely to occur when the flexible conductor is joined to the electrode surface using a method such as ultrasonic joining. Since the holder is made of the insulating material, a metal plate having an excellent heat dissipation property can be used as the mounting plate to which the electronic part is mounted.

According to one or more embodiments of the present invention, a restricting portion that restricts movement of the electrode terminal in a direction away from the holder is provided in at least one of the holder and the electrode terminal in the above electronic part.

Thus, warping or bending of the electrode terminal can be more reliably suppressed when the flexible conductor such as a metal wire or a metal ribbon is joined to the electrode surface.

According to one or more embodiments of the present invention, in the above electronic part, the restricting portion is provided integrally with the electrode terminal, and lock the electrode terminal to the holder.

Thus, warping or bending of the electrode terminal can be reliably suppressed by a simple configuration when the flexible conductor such as a metal wire or a metal ribbon is joined to the electrode surface.

According to one or more embodiments of the present invention, in the above electronic part, the restricting portion is provided on a side of the holder, and holds the electrode terminal with the electrode surface being exposed.

Thus, warping or bending of the electrode terminal can be more reliably suppressed by a simple configuration when the flexible conductor such as a metal wire or a metal ribbon is joined to the electrode surface.

One or more embodiments of the present invention provides a connection structure of an electronic part, characterized by including: the electronic part; a mounting plate to which the electronic part is mounted; a circuit board that is mounted to the mounting plate at a different position from the electronic part; and a flexible conductor having its one end electrically connected to the circuit board, and having the other end joined to the electrode surface.

Connecting the above electronic part to the circuit board by this connection structure suppresses joint failure and the like when the flexible conductor is joined to the electrode surface. Moreover, since the holder is made of the insulating material, a metal plate having an excellent heat dissipation property can be used as the mounting plate to which the electronic part is mounted.

DETAILED DESCRIPTION

Hereinafter, embodiments of the present invention will be described. However, the following embodiments are not intended to limit the invention as defined in the claims. Not all the combinations of features described in the embodiments are required. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
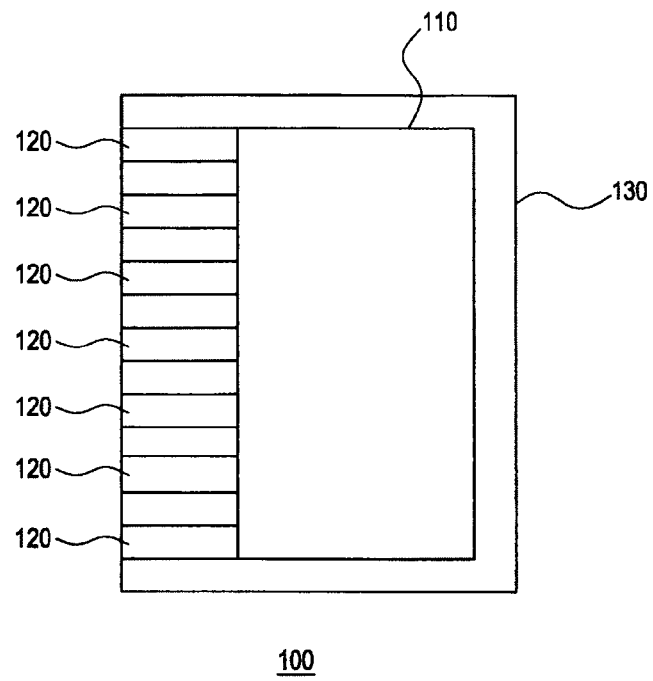
FIG. 1 is a top view of an electronic part 100 according to one or more embodiments of the present invention.
Figure 2:
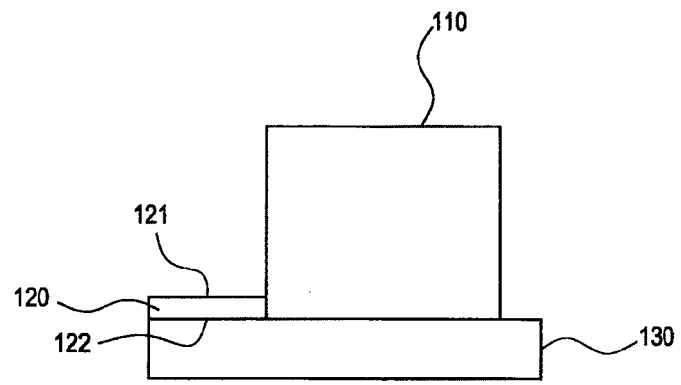
FIG. 2 is a side view of the electronic part 100.
Figure 3:
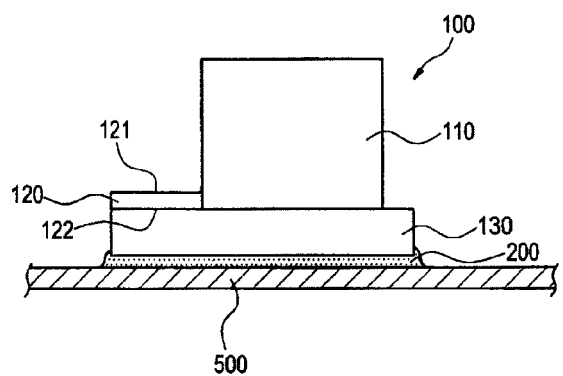
FIG. 3 is a side view of the fixed electronic part 100 fixed on a metal base 500 by an adhesive 200.
Figure 4:
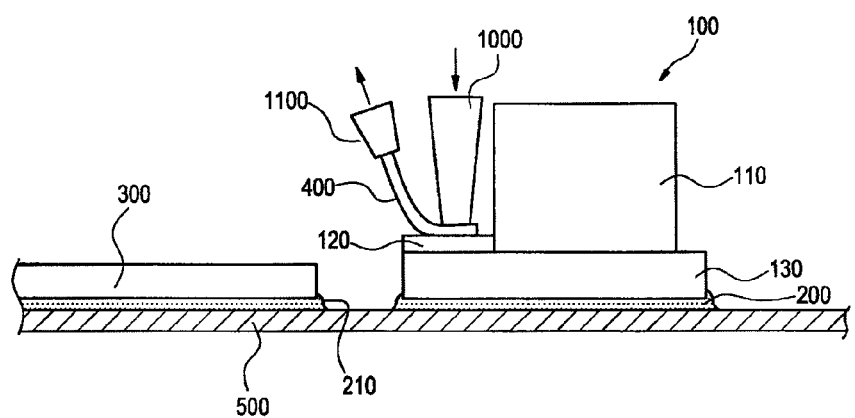
FIG. 4 is a side view showing how electrode terminals 120 of the electronic part 100 are electrically connected by a metal ribbon 400 to a circuit board 300 fixed on the metal base 500 by an adhesive 210.
Figure 5:
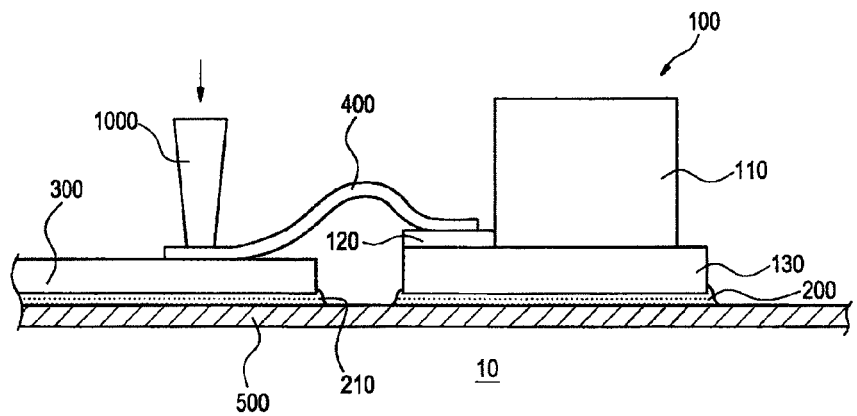
FIG. 5 is a side view showing how the electrode terminals 120 of the electronic part 100 are electrically connected by the metal ribbon 400 to the circuit board 300 fixed on the metal base 500 by the adhesive 210.

FIG. 1 is a top view of an electronic part 100 according to one or more embodiments of the present invention. FIG. 2 is a side view of the electronic part 100. FIG. 3 is a side view of the electronic part 100 fixed on a metal base 500 by an adhesive 200. FIGS. 4 and 5 are side views showing how electrode terminals 120 of the electronic part 100 are electrically connected by a metal ribbon 400 to a circuit board 300 fixed on the metal base 500 by an adhesive 210. Note that the adhesive 200 that fixes the electronic part 100 on the metal base 500 may be the same as the adhesive 210 that fixes the circuit board 300 on the metal base 500.

The electronic part 100 according to one or more embodiments of the present invention is a surface mounting transformer used in, for example, a control apparatus of a vehicular discharge lamp, and as shown in FIG. 1, includes an electronic part body 110, a plurality of electrode terminals 120 extending from a side of the electronic part body 110, and a holder 130 that is placed below the electronic part body 110 and joined to the electronic part body 110. Note that although this example shows the electronic part body 110 substantially in the shape of a rectangular parallelepiped, and the electronic part 100 having the plurality of electrode terminals 120 protruding from one side surface of the electronic part body 110, the shape of the electronic part body 110 and the number of electrode terminals 120 in the electronic part 100 are not limited to this example.

Each of the plurality of electrode terminals 120 is a conductor plate having a substantially rectangular cross section, and protrudes from a lower end of the side surface of the electronic part body 110 substantially in the shape of a rectangular parallelepiped perpendicularly to the side surface (parallel to a bottom surface). The holder 130 is made of for example, an insulating resin material, and is joined to the bottom surface of the electronic part body 110. In this example, the holder 130 extends to lower surfaces 122 of the electrode terminals 120, and is in contact with the lower surfaces 122.

In the case of using the electronic part 100 of this example in the control apparatus of the vehicular discharge lamp, the electronic part 100 is electrically connected to, for example, a circuit board mounted to a common mounting plate. Such a configuration is assembled by, for example, a method shown in FIGS. 3 to 5. That is, as shown in FIG. 3, the electronic part 100 is first fixed on the metal base 500 by the adhesive 200, and as shown in FIGS. 4 and 5, the circuit board 300 fixed on the metal base 500 at a different position from the electronic part 100 by the adhesive 210 is then connected to the electrode terminals 120 of the electronic part 100 by the metal ribbon 400. Note that the metal ribbon 400 is an example of a flexible conductor according to one or more embodiments of the present invention. The metal base 500 is an example of the mounting plate according to one or more embodiments of the present invention.

More specifically, as shown in FIG. 4, a tip end of the metal ribbon 400 pulled out from a ribbon guide 1100 is first placed in contact with upper surfaces 121 of the electrode terminals 120, and the metal ribbon 400 is ultrasonically vibrated by a joining tool 1000 to join the metal ribbon 400 to the upper surfaces 121 (electrode surfaces) of the electrode terminals 120. Then, the metal ribbon 400 is further pulled out from the ribbon guide 1100, and is joined to a conductive pattern formed on an upper surface of the circuit board 300, in a manner similar to that described above.

Because the lower surfaces 122 of the electrode terminals 120 are in contact with the holder 130 as described above, the electrode terminals 120 are supported by the holder 130 from their lower sides when the metal ribbon 400 is ultrasonically joined to the upper surfaces 121 (the electrode surfaces) of the electrode terminals 120. Thus, the electrode terminals 120 are less likely to be warped or bent when joined to the metal ribbon 400, and thus joint failure and the like are less likely to occur. Moreover, since the holder 130 is made of an insulating material in this example, the electronic part 100 can be mounted to the metal base 500 having an excellent heat dissipation property.

Figure 6:
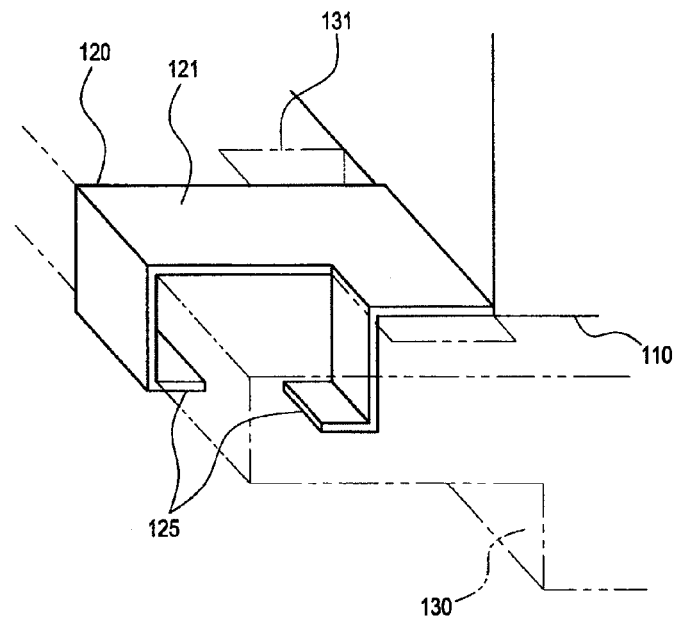
FIG. 6 is an enlarged view showing a region near the electrode terminal 120 in the electronic part 100 in a form in which the electrode terminals 120 are fixed to a holder 130.

The electronic part 100 in a form in which the electrode terminals 120 are fixed to the holder 130 will be described below. FIG. 6 is an enlarged view of a region near the electrode terminals 120 in the electronic part 100 in the form in which the electrode terminals 120 are fixed to the holder 130. Note that in FIG. 6, the holder 130 is shown by an imaginary line for convenience to describe a structure of the electrode terminal 120 (the same applies to FIGS. 7 and 8).

In the terminal structure shown in FIG. 6, the electrode terminal 120 has bifurcated tip ends 125. When the electronic part 100 is assembled, as shown in FIG. 6, the bifurcated tip ends 125 of the electrode terminal 120 are bent so that one of the bifurcated tip ends 125 is inserted in a terminal insertion hole 131 provided in the holder 130 and that the one of the bifurcated tip ends 125, together with the other bifurcated tip end 125, holds the holder 130.

Thus, the tip ends 125 of the electrode terminal 120 function as a restricting portion that restricts movement of the electrode terminal 120 in a direction (for example, upward) away from the holder 130. Forming the electrode terminal 120 of the electronic part 100 with such a terminal structure can prevent warping or bending of the electrode terminal 120 even if the electrode terminal 120 is pulled in the direction (for example, upward) away from the holder 130 when the metal ribbon 400 is joined to the upper surface 121 (the electrode surface) of the electrode terminal 120, whereby joint failure and the like are less likely to occur.

Figure 7:
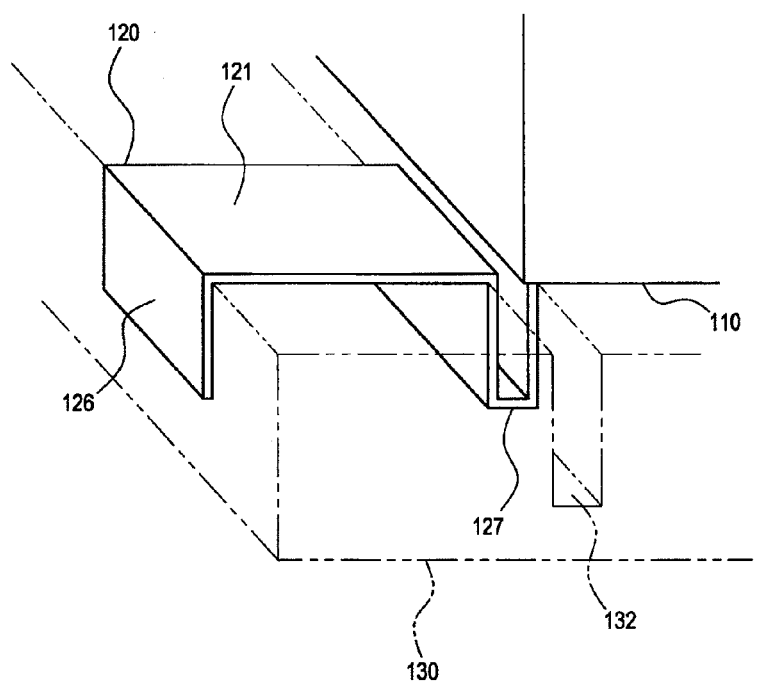
FIG. 7 is an enlarged view showing a region near the electrode terminal 120 in another example of the electronic part 100 in the form in which the electrode terminals 120 are fixed to the holder 130.

FIG. 7 is an enlarged view of a region near the electrode terminal 120 in another example of the electronic part 100 in the form in which the electrode terminals 120 are fixed to the holder 130. In the terminal structure shown in FIG. 7, a bent portion 127, which is formed by bending the electrode terminal 120, is provided on the side of the electronic part body 110 in the electrode terminal 120. In this example, the bent portion 127 protrudes downward, and is press-fitted in a terminal insertion groove 132 provided in the holder 130, so that the bent portion 127 is inserted in the terminal insertion groove 132 in an interference fit manner.

In the terminal structure shown in FIG. 7, a tip end 126 of the electrode terminal 120 is bent so as to contact a side surface of the holder 130, and the tip end 126 and the bent portion 127 of the electrode terminal 120 sandwich a part of the holder 130 therebetween. Thus, in the terminal structure of this example, the tip end 126 and the bent portion 127 of the electrode terminal 120 and the terminal insertion groove 132 of the holder 130 in which the bent portion 127 is inserted function as a restricting portion that restricts movement of the electrode terminal 120 in a direction (for example, upward) away from the holder 130.

Forming the electrode terminal 120 of the electronic part 100 with the terminal structure of this example can prevent warping or bending of the electrode terminal 120 even if the electrode terminal 120 is pulled in the direction (for example, upward) away from the holder 130 when the metal ribbon 400 is joined to the upper surface 121 (the electrode surface) of the electrode terminal 120, as in the above other example. Thus, joint failure and the like are less likely to occur. Moreover, residual stress and the like which is caused when the electrode terminal 120 is joined while being pulled, are less likely to be caused. Accordingly, reliability of the joint surface is improved.

Figure 8:
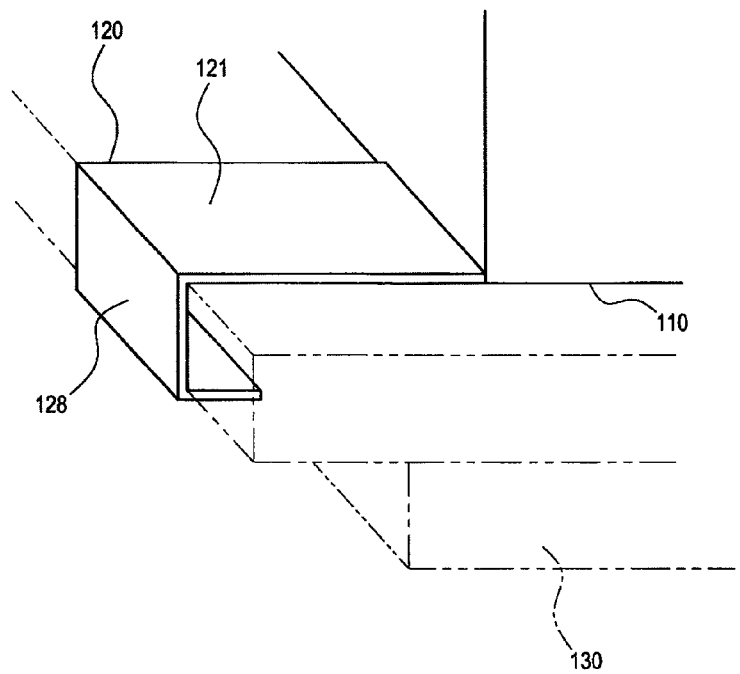
FIG. 8 is an enlarged view showing a region near the electrode terminal 120 in still another example of the electronic part 100 in the form in which the electrode terminals 120 are fixed to the holder 130.

FIG. 8 is an enlarged view of a region near the electrode terminal 120 in still another example of the electronic part 100 in the form in which the electrode terminals 120 are fixed to the holder 130. In the terminal structure of FIG. 8, a tip end 128 of the electrode terminal 120 is bent into a substantially U-shape so that the electrode terminal 120 holds a part of the holder 130.

Thus, in the terminal structure of this example, the tip end 128 of the electrode terminal 120 functions as a restricting portion that restricts movement of the electrode terminal 120 in a direction (for example, upward) away from the holder 130. Forming the electrode terminal 120 of the electronic part 100 with the terminal structure of this example can prevent warping or bending of the electrode terminal 120 even if the electrode terminal 120 is pulled in the direction (for example, upward) away from the holder 130 when the metal ribbon 400 is joined to the upper surface 121 (the electrode surface) of the electrode terminal 120, as in the above other examples. Thus, joint failure and the like are less likely to occur. Moreover, residual stress and the like, which is caused when the electrode terminal 120 is joined while being pulled, are less likely to be caused. Accordingly, reliability of the joint surface is improved.

Figure 9:
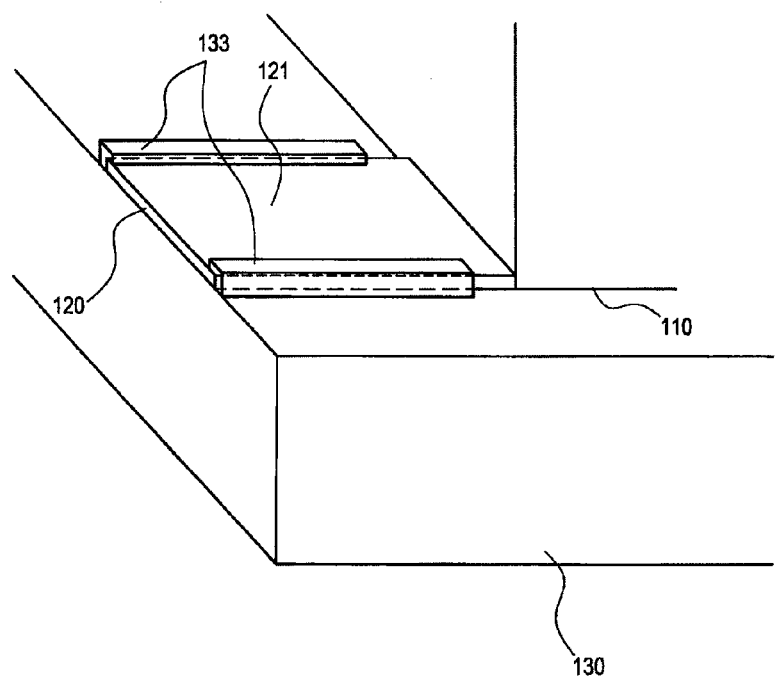
FIG. 9 is an enlarged view showing a region near the electrode terminal 120 in yet another example of the electronic part 100 in the form in which the electrode terminals 120 are fixed to the holder 130.

FIG. 9 is an enlarged view of a region near the electrode terminal 120 in yet another example of the electronic part 100 in the form in which the electrode terminals 120 are fixed to the holder 130. In the terminal structure of FIG. 9, the electrode terminal 120 is inserted in a terminal insertion portion 133 provided in the holder 130, and the terminal insertion portion 133 does not allow the electrode terminal 120 to move in horizontal and perpendicular directions with respect to the holder 130.

Thus, in the terminal structure of this example, the terminal insertion portion 133 provided in the holder 130 functions as a restricting portion that restricts movement of the electrode terminal 120 in a direction away from the holder 130. Forming the electrode terminal 120 of the electronic part 100 with the terminal structure of this example can prevent warping or bending of the electrode terminal 120 even if the electrode terminal 120 is pulled when the metal ribbon 400 is joined to the upper surface 121 (the electrode surface) of the electrode terminal 120, as in the above other examples. Thus, joint failure and the like are less likely to occur. Moreover, residual stress and the like, which is caused when joining is performed with the electrode terminal 120 being pulled, are less likely to be caused. Accordingly, reliability of the joint surface is improved.

Figure 10:
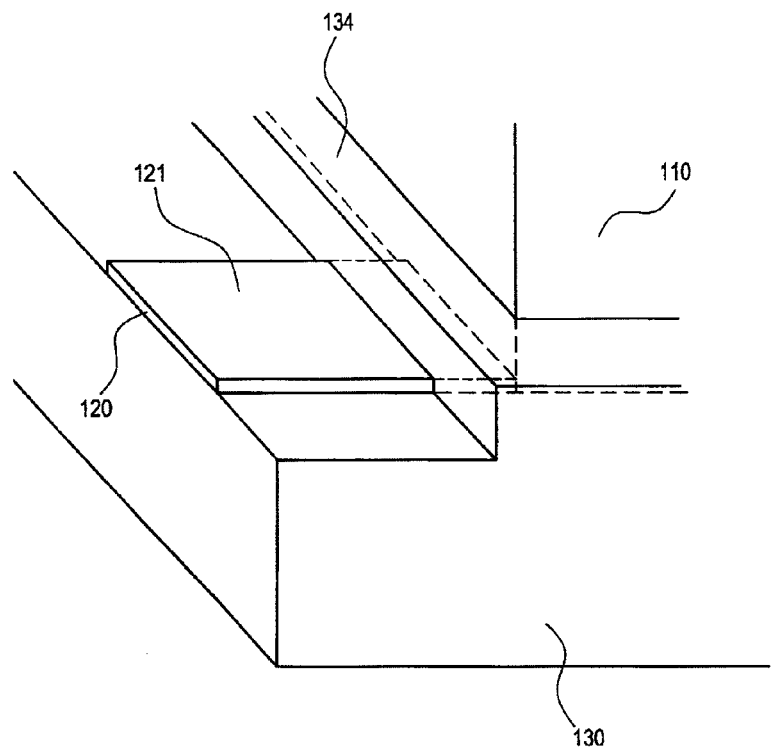
FIG. 10 is an enlarged view showing a region near the electrode terminal 120 in a further example of the electronic part 100 in the form in which the electrode terminals 120 are fixed to the holder 130.

FIG. 10 is an enlarged view of a region near the electrode terminal 120 in a further example of the electronic part 100 in the form in which the electrode terminals 120 are fixed to the holder 130. In the terminal structure of FIG. 10, a part of the electrode terminal 120 is sealed by a terminal sealing portion 134 formed integrally with the holder 130. Thus, the electrode terminal 120 is not allowed to move in the horizontal and perpendicular directions with respect to the holder 130.

Accordingly, in the terminal structure of this example, the terminal sealing portion 134 functions as a restricting portion that restricts movement of the electrode terminal 120 in a direction away from the holder 130. It should be understood that the terminal sealing portion 134 is provided so that the upper surface 121 (the electrode surface) of the electrode terminal 120 is exposed in an area sufficient for joining of the metal ribbon 400. Forming the electrode terminal 120 of the electronic part 100 with the terminal structure of this example can prevent warping or bending of the electrode terminal 120 even if the electrode terminal 120 is pulled when the metal ribbon 400 is joined to the upper surface 121 (the electrode surface) of the electrode terminal 120, as in the above other examples. Thus, joint failure and the like are less likely to occur. Moreover, residual stress and the like, which is caused when the electrode terminal 120 is joined while being pulled, are less likely to be caused. Accordingly, reliability of the joint surface is improved.

Figure 11:
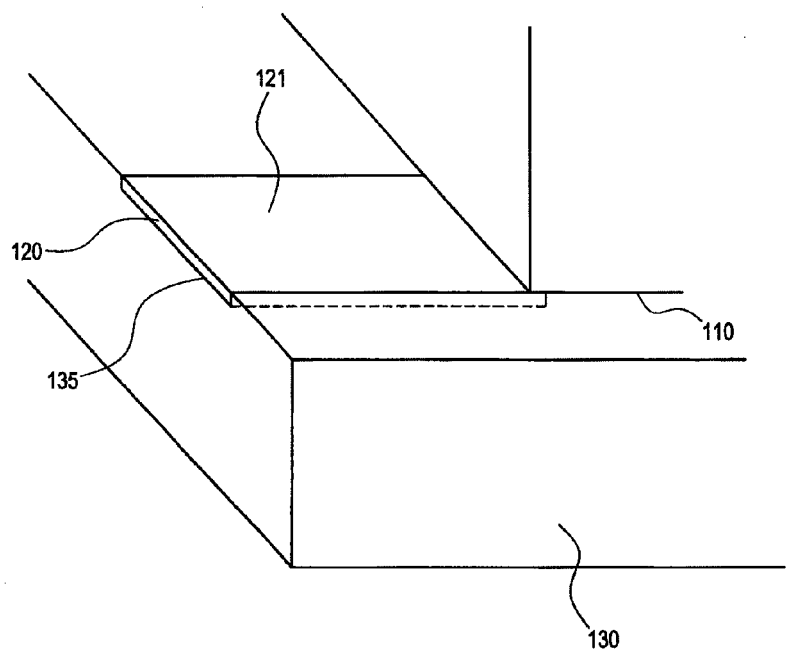
FIG. 11 is an enlarged view showing a region near the electrode terminal 120 in a still further example of the electronic part 100 in the form in which the electrode terminals 120 are fixed to the holder 130.

FIG. 11 is an enlarged view of a region near the electrode terminal 120 in a still further example of the electronic part 100 in the form in which the electrode terminals 120 are fixed to the holder 130. In the terminal structure shown in FIG. 11, a terminal engagement groove 135 having substantially the same width as that of the electrode terminal 120 (a width slightly narrower than that of the electrode terminal 120) is formed in the holder 130, and the electrode terminal 120 is press-fitted in the terminal engagement groove 135, so that the electrode terminal 120 is inserted in the terminal engagement groove 135 in an interference fit manner. Thus, the electrode terminal 120 is not allowed to move in the horizontal and perpendicular directions with respect to the holder 130.

Accordingly, in the terminal structure of this example, the terminal engagement groove 135 provided in the holder 130 functions as a restricting portion that restricts movement of the electrode terminal 120 in a direction away from the holder 130. Forming the electrode terminal 120 of the electronic part 100 with the terminal structure of this example can prevent warping or bending of the electrode terminal 120 even if the electrode terminal 120 is pulled when the metal ribbon 400 is joined to the upper surface 121 (the electrode surface) of the electrode terminal 120, as in the above other examples. Thus, joint failure and the like are less likely to occur. Moreover, residual stress and the like, which is caused when the electrode terminal 120 is joined while being pulled, are less likely to be caused. Accordingly, reliability of the joint surface is improved.

Although the present invention is described with respect to embodiments, the technical scope of the present invention is not limited to that described in the above embodiments. It will be apparent to those skilled in the art that various modifications or improvement can be made to the above embodiments. It will become apparent from the claims that embodiments to which such modifications or improvements have been added are also included in the technical scope of the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE NUMERALS

100 ELECTRONIC PART
110 ELECTRONIC PART BODY
120 ELECTRODE TERMINAL
121 UPPER SURFACE (ELECTRODE SURFACE)
122 LOWER SURFACE
125, 126, 128 TIP END (RESTRICTING PORTION)
127 BENT PORTION (RESTRICTING PORTION)
130 HOLDER
131 TERMINAL INSERTION HOLE
132 TERMINAL INSERTION GROOVE (RESTRICTING PORTION)
133 TERMINAL INSERTION PORTION (RESTRICTING PORTION)
134 TERMINAL SEALING PORTION (RESTRICTING PORTION)
135 TERMINAL ENGAGEMENT PORTION (RESTRICTING PORTION)
200, 210 ADHESIVE
300 CIRCUIT BOARD (CIRCUIT BOARD FOR CONTROLLING LIGHTING OF DISCHARGE LAMP)
400 METAL RIBBON (FLEXIBLE CONDUCTOR)
500 METAL BASE (MOUNTING PLATE)
1000 JOINING TOOL
1100 RIBBON GUIDE

What is claimed is:

1. An electronic part comprising:
an electronic part body;
an electrode terminal that protrudes from the electronic part body, wherein the electrode terminal electrically connects the electronic part to an external electrode when a flexible conductor is ultrasonically joined to an electrode surface of the electrode terminal; and
a holder made of an insulating material, and joined to the electronic part body,
wherein the holder is in contact with a rear surface of the electrode terminal opposite from the electrode surface, and
wherein the electrode terminal is a conductor plate having a substantially rectangular cross-section.

2. The electronic part according to claim 1, wherein a restricting portion that restricts movement of the electrode terminal in a direction away from the holder is provided in at least one of the holder and the electrode terminal.

3. The electronic part according to claim 2, wherein the restricting portion is provided integrally with the electrode terminal, and locks the electrode terminal to the holder.

4. The electronic part according to claim 2,
wherein the restricting portion is provided on a side of the holder, and
wherein the restricting portion holds the electrode terminal with the electrode surface being exposed.

5. A connection structure of an electronic part comprising:
the electronic part according to claims 1
a mounting plate to which the electronic part is mounted;
a circuit board that is mounted to the mounting plate at a different position from the electronic part; and
wherein the flexible conductor has a first end thereof electrically connected to the circuit board, and a second end thereof joined to the electrode surface.

6. The electronic part according to claim 3, wherein the restricting portion is provided on a side of the holder, and wherein the restricting portion holds the electrode terminal with the electrode surface being exposed.

7. A connection structure of an electronic part comprising:
the electronic part according to claim 2;
a mounting plate to which the electronic part is mounted;
a circuit board that is mounted to the mounting plate at a different position from the electronic part; and
wherein the flexible conductor has a first end thereof electrically connected to the circuit board, and a second end thereof joined to the electrode surface.

8. A connection structure of an electronic part comprising:
the electronic part according to claim 3;
a mounting plate to which the electronic part is mounted;
a circuit board that is mounted to the mounting plate at a different position from the electronic part; and
wherein the flexible conductor has a first end thereof electrically connected to the circuit board, and a second end thereof joined to the electrode surface.

9. A connection structure of an electronic part comprising:
the electronic part according to claim 4;
a mounting plate to which the electronic part is mounted;
a circuit board that is mounted to the mounting plate at a different position from the electronic part; and
wherein the flexible conductor has a first end thereof electrically connected to the circuit board, and a second end thereof joined to the electrode surface.

10. A method for manufacturing an electronic part comprising:
providing an electronic part body;
forming an electrode terminal to protrude from the electronic part body,
ultrasonically joining an electrode surface of the electrode terminal to a flexible conductor so that the electrode terminal electrically connects the electronic part to an external electrode,
joining a holder made of an insulating material to the electronic part body,
wherein the holder is in contact with a rear surface of the electrode terminal opposite from the electrode surface, and
wherein the electrode terminal is a conductor plate having a substantially rectangular cross-section.

* * * * *